United States Patent

[11] 3,577,043

[72] Inventor Robert C. Cook
Worcester Township, Pa.
[21] Appl. No. 688,766
[22] Filed Dec. 7, 1967
[45] Patented May 4, 1971
[73] Assignee United Aircraft Corporation
East Hartford, Conn.

[54] MOSFET WITH IMPROVED VOLTAGE BREAKDOWN CHARACTERISTICS
1 Claim, 1 Drawing Fig.

[52] U.S. Cl. .......... 317/235R, 317/235AB, 317/235AG
[51] Int. Cl. .......... H01l 11/14, H01l 19/00
[50] Field of Search .......... 317/235/22.2, 235/21.1

[56] References Cited

UNITED STATES PATENTS 3,456,169 7/1969 Klein .......... 317/235
3,383,569 5/1968 Luescher .......... 317/235

OTHER REFERENCES

Richman, Characteristics and Operation of MOS Field Effect Devices, McGraw-Hill, 1967. pp. 77— 79.
" MOSFET for analog switching," Electronics, Vol. 38, Sept. 8, 1965, page 155

*Primary Examiner*—John W. Huckert
*Assistant Examiner*—Martin H. Edlow
*Attorney*—Melvin Pearson Williams

ABSTRACT: A low resistivity impurity barrier prevents inversion layer conduction between a MOSFET protection diode and the source (or drain). Adjusting the spacing and impurity gradient between the impurity barrier and the protection diode results in control over reverse bias breakdown between the diode impurity and the low resistivity barrier, rather than with the substrate, whereby a lower, controlled breakdown voltage may be achieved.

PATENTED MAY 4 1971 3,577,043
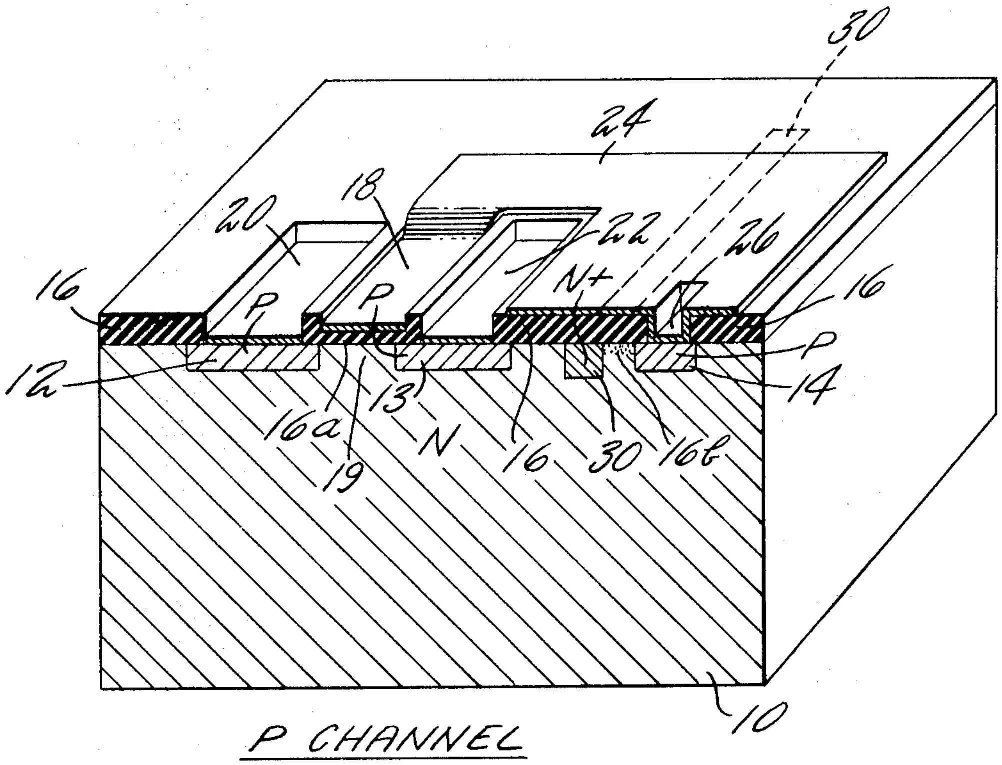
P CHANNEL
INVENTOR
ROBERT C. COOK
BY Melvin Pearson Williams
ATTORNEY

MOSFET WITH IMPROVED VOLTAGE BREAKDOWN CHARACTERISTICS

BACKGROUND OF THE INVENTION

1. Field of the Invention

This invention relates to metal oxide silicon field effect transistors, and more particularly to improvements in the voltage breakdown and high voltage protection characteristics thereof.

2. Description of the Prior Art

Metal oxide silicon field effect transistors known to the prior art have included a diode diffusion which is usually provided to the same depth and concentration as the source and drain diffusions during a single diffusion step. This diode diffusion is connected, by metalization, to the metal gate layer of the MOSFET. It is known that this diode will have a nondestructive internal arcing when the reverse bias potential thereon reaches a certain limit. This voltage limit at which the diode will break down is chosen to be lower than the voltage at which there will be an arcing through the oxide which separates the gate from the channel region of the substrate. Thus, the diode breaks down and limits the voltage which can be impressed across the gate oxide, so the oxide is not destroyed by arcing as a result of high reverse biasing of the gate. However, for utmost reliability, it is difficult to achieve the desired diode protection breakdown characteristics unless a separate diffusion step is made, which of course not only is more expensive, but adds to problems of achieving a reasonably high yield of wafers of MOSFET devices which are so produced. Additionally, the exact nature and characteristics of the behavior of MOSFETS when stressed by high reverse potentials have not entirely been known.

SUMMARY OF INVENTION

In accordance with the present invention, the breakdown of a MOSFET as a result of high reverse biasing of the gate has been identified as partly attributable to inversion layer conduction between the protection diode and the source or drain of the MOSFET, and this is eliminated in accordance herewith by providing a low resistivity, high concentration impurity of the same conductivity type as the substrate between the protection diode and the source or drain. In accordance further with the present invention, the voltage at which the protection diode will arc over is lowered and controlled by positioning the high concentration inversion layer barrier, referred to hereinbefore, in such a fashion, and by so controlling the diffusion of this barrier and of the diode so as to achieve a proper impurity concentration gradient therebetween to provide a desired voltage breakdown characteristic between the diode and the high concentration barrier.

Other objects, features and advantages of the present invention will become more apparent in the light of the following detailed description of preferred embodiments thereof, as illustrated in the accompanying drawing.

BRIEF DESCRIPTION OF THE DRAWING

The sole FIGURE herein comprises a sectioned perspective of a MOSFET in accordance with the present invention.

DESCRIPTION OF THE PREFERRED EMBODIMENT

For illustrative purposes only, the FIGURE herein illustrates a P-channel MOSFET which is constructed on an N-type substrate 10, which may be provided in any one of a number of suitable fashions which are well known in the art. Through well-known processing techniques, three areas 12—14 of opposite conductivity type (P-type in the example of the FIGURE are diffused into the substrate 10. The areas 12, 13 may be used as the source and drain, or drain and source, respectively, as desired (in accordance with well-known teachings of the prior art). The area 14 comprises the diffused portion of the protection diode. A layer of silicon dioxide 16 passivates the device, and further provides the dielectric between the gate metalization 18 and the channel region 19 of the substrate 10. It is the gate 18, the oxide **16*a* immediately adjacent thereto, and the channel region 19 which comprise the control portion of the MOSFET (as is known in the art). Metalization 20, 22 is also provided to make contact with the regions 12, 13 which comprise the source and drain of the MOSFET. The gate 18 is also connected by metalization 24 to a contact area 26 on the protection diode. When a reverse bias potential is applied to the metalization of the gate 18, it is necessarily also applied to the connection metalization 24 and to the contact metalization 26 of the diode 14. This potential is typically negative and therefore causes a depletion of electrons (one type of carrier) in the region of the substrate 10 immediately beneath the oxide 16 between the areas 13 and 14. This results in an excess of holes (carriers of the plus type), so that current can conduct from the diode area 14 to the source or drain area 13. Since the diode is in direct contact with the metalization 18, 24, 26, this therefore results in substantially a short circuit between the gate 18 and the region 13**.

Thus, rather than a breakdown across the gate oxide **16*a*, conduction between the gate 18 and the source or drain region 13 can take place through the metalization 24, 26 and then through the diode 14 back to the area 13 within the substrate 10. Having discovered this, my invention proposes the elimination of this form of "voltage breakdown" by providing a barrier for the inversion layer between the area 13 and the area 14. This barrier comprises a high concentration of the same conductivity type as the substrate 10, the impurity being diffused into the substrate 10 so as to completely block direct conduction between the areas 13 and 14. As shown in the FIG. in the example being utilized, an N-plus barrier 30 is diffused in such a configuration as to completely block any conduction between the areas 13 and 14 underneath the metalization 18, 24, 26. This N-plus area is of a sufficient concentration of N-type impurity so as to preclude rendering the substrate area between the P-type areas 13, 14 P-type, thereby precluding the formation of an inversion layer P-channel between the areas 13, 14**.

It should be noted that a P-channel MOSFET is utilized as an example herein, but that an N-channel MOSFET may similarly take advantage of the present invention by using a high concentration of P-type impurity between the N-type diode and N-type source and drain in a P-channel MOSFET, thereby to prevent the formation of an N-channel between the diode and the source or drain, as the case may be, in accordance with the teachings hereinbefore.

A further aspect of the invention provides the adjustment of the concentration gradient between the P-type area 14 and the high concentration N-plus area 30 so that the two areas 30, 14 will break over at a given potential, which I have found can be maintained at a lower potential than is necessary for break over between the P-type area 14 and the N-type substrate 10. Since the N-plus region 30 is of the same conductivity type as the substrate 10, once conduction is established by an arc over between the P-type area 14 and the N-plus area 30, this conduction will continue through the substrate 10. The exact spacing and configuration of the high concentration barrier region 30 can be achieved in any given MOSFET being implemented with little experimentation. All that is required is to place the region 30 close to the region 14. For instance, if a mask set were being designed to accomplish the present invention, the distance between the cut for the N-plus region and the cut for the P-region 14 may be on the order of 1 mil or less.

It should be understood that the invention herein provides two distinct improvements in MOSFETS, not heretofore available. First of all, the device is prevented from breaking down by means of inversion layer conduction; this gives the device the capability of having a higher reverse bias characteristic. Secondly, this higher reverse bias characteristic does not render the device unreliable due to the propensity of these higher voltages which may be impressed thereon for breaking down the gate oxide **16*a*, which separates the gate 18 from the channel 19**. Instead, the voltage at which diode protection will come into action is closely controlled, so that breakdown will be able to occur at a voltage which is just slightly in excess of the voltage to which the device is designed to operate. Thus, the device is capable of withstanding higher reverse bias voltages on the gate, and is more likely not to break down at these higher voltages in a manner which is destructive to the device.

Although the invention has been shown and described with respect to preferred embodiments thereof, it should be understood by those skilled in the art that various changes and omissions in the form and detail thereof may be made therein without departing from the spirit and the scope of the invention.

I claim:

1. A metal oxide silicon field effect transistor comprising:

a substrate of a first conductivity type having a major surface an oxide layer on said substrate surface, a metal gate disposed on said oxide;

diffused regions of a conductivity type opposite to said first conductivity type in said substrate adjacent said major surface, a pair of said regions comprising the source and the drain and the other of said regions comprising a reverse bias protection breakdown diode a metal connection between said gate and said other of said region, a first one of said pair of regions being disposed between said diode region and the other of said pair of regions;

a surface barrier region diffused in said substrate adjacent said major surface between said diode region and said first one of said pair of regions and being of an impurity of the same conductivity type as said substrate but of a higher concentration than that of said substrate, said barrier region preventing inversion layer conduction between said first one of said pair of regions and said diode region, said barrier region being disposed with respect to said diode region and having an impurity concentration selected to provide a breakdown voltage between said barrier region and said diode region which is lower than the breakdown voltage between said diode region and said substrate.